United States Patent
Toyama et al.

(10) Patent No.: US 7,592,202 B2
(45) Date of Patent: Sep. 22, 2009

(54) EMBEDDING DEVICE IN SUBSTRATE CAVITY

(75) Inventors: Munehiro Toyama, Tsukubashi (JP); Charan Gurumurthy, Higley, AZ (US); Toshimi Kohmura, Tsuchiura (JP)

(73) Assignee: Intel Corporation, Santa Clara, CA (US)

( * ) Notice: Subject to any disclaimer, the term of this patent is extended or adjusted under 35 U.S.C. 154(b) by 376 days.

(21) Appl. No.: 11/395,021

(22) Filed: Mar. 31, 2006

(65) Prior Publication Data
US 2007/0232050 A1 Oct. 4, 2007

(51) Int. Cl.
*H01L 21/00* (2006.01)
(52) U.S. Cl. .................. 438/108; 257/E21.503
(58) Field of Classification Search .......... 438/108, 438/109
See application file for complete search history.

(56) References Cited

U.S. PATENT DOCUMENTS

| | | | |
|---|---|---|---|
| 5,258,094 A | 11/1993 | Furui et al. | |
| 6,706,553 B2 * | 3/2004 | Towle et al. | 438/106 |
| 7,042,077 B2 * | 5/2006 | Walk et al. | 257/686 |
| 2003/0137046 A1 * | 7/2003 | Kageyama | 257/704 |
| 2004/0113254 A1 * | 6/2004 | Karnezos | 257/686 |
| 2004/0231141 A1 | 11/2004 | Nishinaka et al. | |
| 2005/0194696 A1 | 9/2005 | Shin et al. | |
| 2007/0257356 A1 * | 11/2007 | Abe et al. | 257/700 |
| 2008/0206926 A1 * | 8/2008 | Sakamoto et al. | 438/110 |

OTHER PUBLICATIONS

Foreman, Tom, et al.; "Improved Yields and Etching Latitude with Wet Lamination of Thin Dry Film Photoresists", Online: http://www.circuitree.com/Articles/Feature_Article/93ce8a1fc08d7010VgnVCM100000f932a8c0_; posted Sep. 1, 2001.
Baaqmd—Bay Area Air Quality Management District; "Printed Circuit Board", Online: http://www.baaqmd.gov/pmt/handbook/s07c01pd.htm; Nov. 5, 2001.
Burgess, Larry W., "Introducing Via-in-Pad Blind Via Technology to Any PCT Multilayer Fabricator", IPC Printed Circuits Expo '97, Mar. 9-13, 1997. Online: http://www.laservia.com/PDF/ipc97.pdf.

* cited by examiner

*Primary Examiner*—Fernando L Toledo
*Assistant Examiner*—Grant S Withers
(74) *Attorney, Agent, or Firm*—Blakely, Sokoloff, Taylor & Zafman LLP (57) ABSTRACT

An embodiment of the present invention is a technique to reduce interconnect length between devices. A cavity is formed in a substrate having a substrate surface. The cavity has a depth. A first device having a device surface and a thickness is placed into the cavity. The thickness matches the depth such that the device surface is approximately planar with the substrate surface. The first device is attached to a second device via bumps on the second device.

7 Claims, 9 Drawing Sheets

EMBEDDING DEVICE IN SUBSTRATE CAVITY

BACKGROUND

1. Field of the Invention

Embodiments of the invention relate to the field of semiconductor, and more specifically, to semiconductor fabrication.

2. Description of Related Art

The performance of microprocessors depends on a number of factors. One important factor is the propagation delay caused by interconnection wires. A long interconnection wiring pattern may increase stray capacitances, leading to degradation of signal quality and increased propagation delay. When a processor is connected to devices such as memory devices or a chipset, this increased propagation delay may reduce the operating frequency of the processor.

Existing techniques to reduce interconnect distance between a processor and peripheral devices have a number of disadvantages. One technique routes the signal traces through the substrate by a flexible circuit layer. This technique is not cost effective, requiring the fabrication of the flexible circuit layer. In addition, it may not reduce stray capacitances significantly.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to reduce interconnection length between devices. A cavity is formed in a substrate having a substrate surface. The cavity has a depth. A first device having a device surface and a thickness is placed into the cavity. The thickness matches the depth such that the device surface is approximately planar with the substrate surface. The first device is attached to a second device via bumps on the second device.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to reduce interconnection length between devices. A first device is placed in a cavity of a substrate of a circuit board. A second device is placed partly on the substrate and partly on the first device. The two devices are connected or attached together via bumps formed on both devices. The technique achieves the shortest interconnection length between the two devices by directly attaching the two devices together via a flip-chip attaching process. The cavity of the substrate may be formed by two methods. In the first method, a substrate is created with the suitable layers and interconnect patterns as usual. Then, the substrate is drilled or etched away using any one of an etching process, a laser drilling, and a mechanical drilling bit, to form a cavity. The depth and width of the cavity match the size of the first device such that when it is placed inside the cavity, its surface is approximately planar with the substrate surface. In the second method, a semi additive process (SAP) is iteratively performed with a dry resist film (DRF) until the desired cavity depth is reached.

Figure 1A:
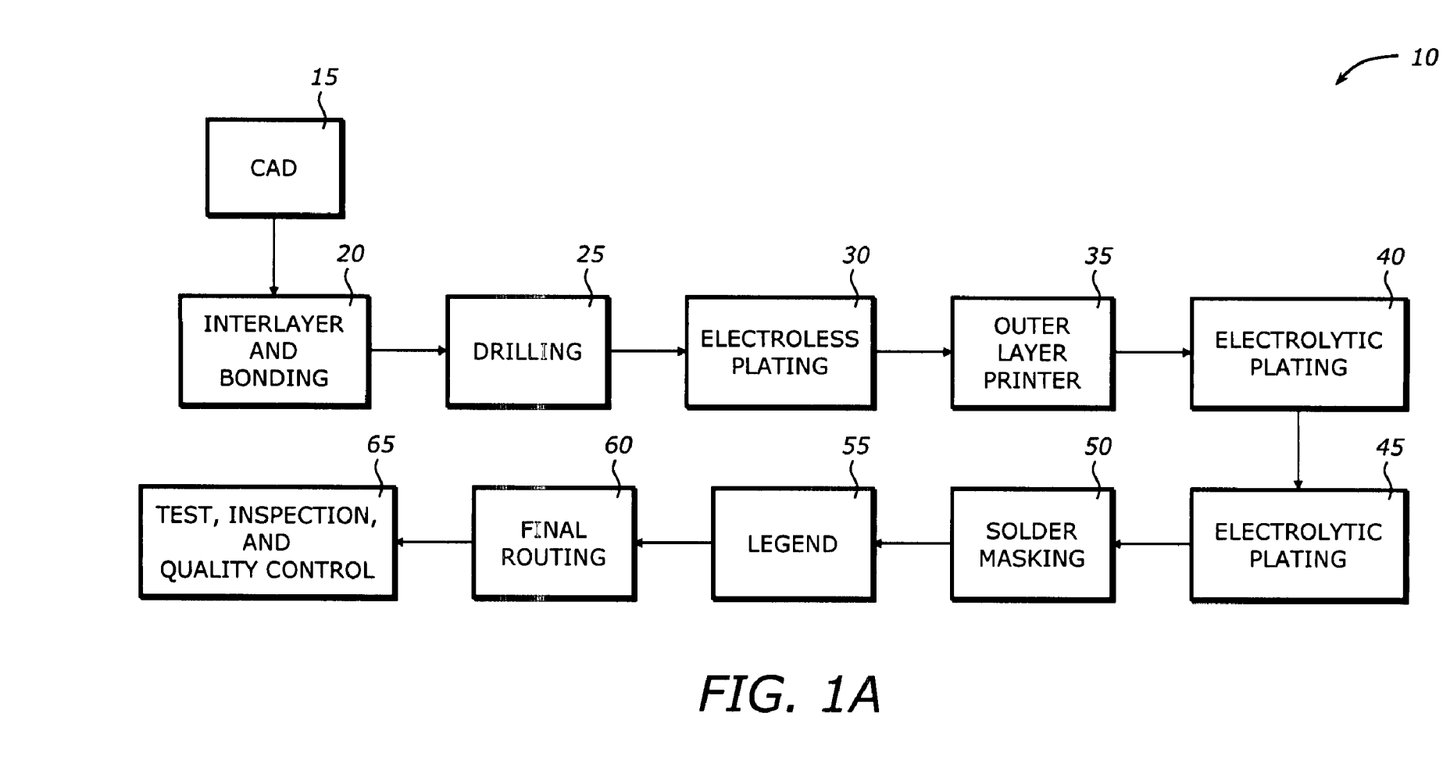
FIG. 1A is a diagram illustrating a circuit board fabrication process in which one embodiment of the invention can be practiced.

FIG. 1A is a diagram illustrating a circuit board fabrication process 10 in which one embodiment of the invention can be practiced. The process 10 includes a computer aided design (CAD) phase 15, an inner layer and bonding phase 20, a drilling phase 25, an electroless plating phase 30, an outer layer printing phase 35, an electrolytic plating phase 40, an etching and stripping phase 45, a solder mask phase 50, a legend phase 55, a final routing phase 60, and a test, inspection, and quality control phase 65.

During the CAD phase 15, the patterns for the circuits, solder mask, etc. are created with the CAD or electronic design automation (EDA) tools. The design tool typically routes the signal traces on several layers and creates digital data representing the layout of the circuit. An artwork is created from the digital data to photo tools. The digital data are also used in controlling the drilling and testing of the board.

During the inner layer and bonding phase 20, an innerlayer panel consisting of epoxy base materials is covered by metal foils, such as copper foils. A layer of photo-resist material is applied to both sides of the panel. The circuit image created by the CAD phase 15 is placed over the photo-resist layer. The resist is then exposed to ultra violet (UV) light. The resist under the dark area becomes soft and the resist under the clear area becomes hardened. The panel is then passed through a developing process which removes the soft resist and leaves the hardened resist. The hardened resist protects the copper beneath it. The hardened resist is then stripped, leaving the copper lines on the base material, or substrate core. An oxide process may then used to improve adhesion of the layers by forming a dark crystalline structure. Any moisture is then removed by baking. The layers are then bonded together by heat and/or pressure. Dielectric layers may be deposited between the layers.

During the drilling phase 25, the panel is drilled using the CAD data to form holes. The drilling may be performed by automated drilling machines with placement controlled by a drill file from the CAD phase 15. The drilling may also be performed with laser drilling. Plated-through holes (PTH) may be formed to provide electrical connections between the various layers in the board. Non plated through holes may be formed to attach connectors or other devices. During the electroless plating phase 30, electroless copper plating is performed to provide electrical interconnections to all copper interfaces. During the outer layer printing phase 35, a photo-resist layer is applied to the panel surface and a photo exposure process is performed using the CAD data. The panel is then developed to remove undesired resist. During the electrolytic plating phase 40, an electrolytic copper plating builds up the copper plating thickness in the holes and the traces.

During the etching and stripping phase 45, in one embodiment, a protective layer, such as tin, is plated over surface of the copper to protect the copper lines from etching. The resist is then stripped off, and the exposed copper not protected by tin is etched away leaving the desired circuit pattern. The protective layer is then stripped off to leave the exposed copper circuitry. As will be discussed later, in another embodiment, a semi additive process (SAP) may be employed during this phase to form a cavity in the substrate.

During the solder mask phase 50, a liquid photo imageable solder mask is used to protect the circuits and provides electrical insulation. Any technique to coat the solder mask may be used such as curtain coating, electrostatic spraying, or screen coating. A photo tool is placed over the panel. The solder mask is then exposed to UV light and the panel is developed to wash away the unexposed solder mask. The solder mask is then cured.

During the legend phase 55, the legends or labels are printed on the panel using a printing process such as a silk screening process. The silk screen text may indicate component designators, test points, or any other labels. During the final routing phase 60, a route bit may be used to cut or trim the panel to the desired board contour. During the test, inspection, and quality control phase 65, the electrical integrity of the circuit is tested using a test fixture. A final inspection checks for visual defects.

In one embodiment, after the circuit board is created, a cavity may be formed by etching an area of the substrate. In another embodiment, a cavity may be formed using a SAP in the electroless plating phase 30, the electrolytic plating phase 40, and the etching and stripping phase 45. A laser drilling or etching may be employed to etch the substrate to form a cavity. After the cavity is formed, a first device is placed into the cavity. Solder bumps are then formed on the first device and the substrate. During the component placement phase, a second device is attached to the first device by reflowing the bumps on the second device and the bumps formed on the substrate and the first device.

Figure 1B:
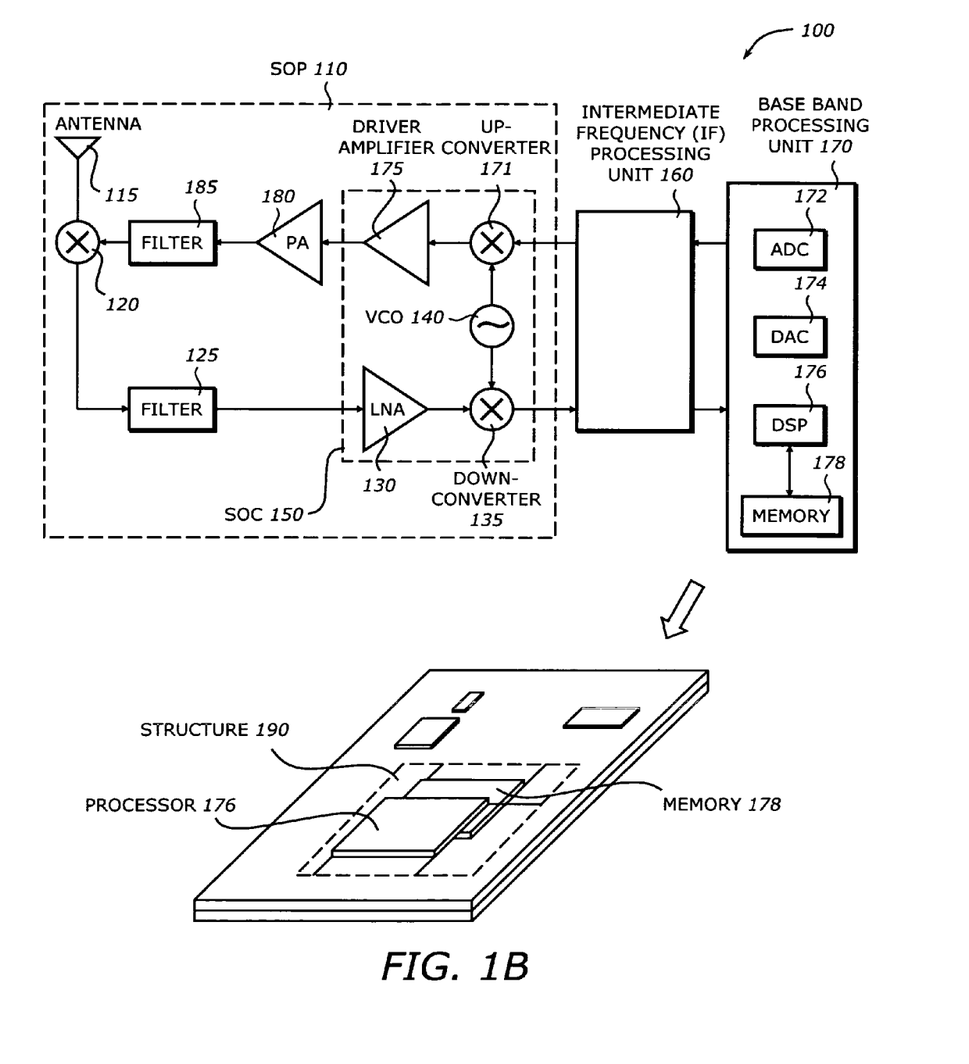
FIG. 1B is a diagram illustrating a system according to one embodiment of the invention.

FIG. 1B is a diagram illustrating a system 100 according to one embodiment of the invention. The system 100 represents a mobile communication module. It includes a system on package (SOP) 110, an intermediate frequency processing unit 160, and a base-band processing unit 170.

The SOP 110 represents the front end processing unit for the mobile communication module. It is a transceiver incorporating on-package integrated lumped passive components as well as radio frequency (RF) components. It includes an antenna 115, a duplexer 120, a filter 125, a system-on-chip (SOC) 150, a power amplifier (PA) 180, and a filter 185.

The antenna 115 receives and transmits RF signals. The RF signals may be converted to digital data for processing in subsequent stages. It is designed in compact micro-strip and strip-line for L and C-band wireless applications. The duplexer 120 acts as a switch to couple to the antenna 115 to the receiver and the transmitter to the antenna 115. The filters 125 and 185 are C-band LTCC-strip-line filter or multilayer organic lumped-element filter at 5.2 GHz and narrowband performance of 200 MHz suitable for the Institute of Electrical and Electronic Engineers (IEEE) 802.11 wireless local area network (WLAN). The SOC 150 includes a low noise amplifier (LNA) 130, a down converter 135, a local voltage controlled oscillator (VCO) 140, an up converter 171, and a driver amplifier 175. The LNA 130 amplifies the received signal. The down converter 135 is a mixer to convert the RF signal to the IF band to be processed by the IF processing unit 160. The up converter 171 is a mixer to convert the IF signal to the proper RF signal for transmission. The VCO 140 generates modulation signal at appropriate frequencies for down conversion and up conversion. The driver amplifier 175 drives the PA 180. The PA 180 amplifies the transmit signal for transmission.

The IF processing unit 160 includes analog components to process IF signals for receiving and transmission. It may include a band-pass filter and a low pass filter at suitable frequency bands. The filter may provide base-band signal to the base-band processing unit 170. The base-band processing unit 170 may include an analog-to-digital converter (ADC) 172, a digital-to-analog converter (DAC) 174, a digital signal processor (DSP) 176, and a memory device 178. The ADC 172 and the DAC 174 are used to convert analog signals to digital data and digital data to analog signal, respectively. The DSP 176 is a programmable processor that may execute a program to process the digital data. The DSP 176 may be packaged using Flip-Chip Ball Grid Array (FCBGA) packaging technology or any other suitable packaging technologies. The base-band processing unit 170 may also include other memory and peripheral components. The DSP 176 may, therefore, be coupled to the front end processing unit via the IF processing unit 160 and/or the base-band processing unit 170 to process the digital data.

The SOP 110 may be a multi-layer three-dimensional (3D) architecture for a monolithic microwave integrated circuit (MMIC) with embedded passives (EP) technology. It may be implemented using Low Temperature Co-fired Ceramics (LTCC) and organic-based technologies. The base-band processing unit 170 may be implemented on a circuit board. The DSP 176 and the memory device 178 may form a structure 190. The memory device 178 may be embedded inside the circuit board, such as being placed in a cavity. The DSP 176 may be connected to the memory device 178 by direct reflowing.

Figure 2:
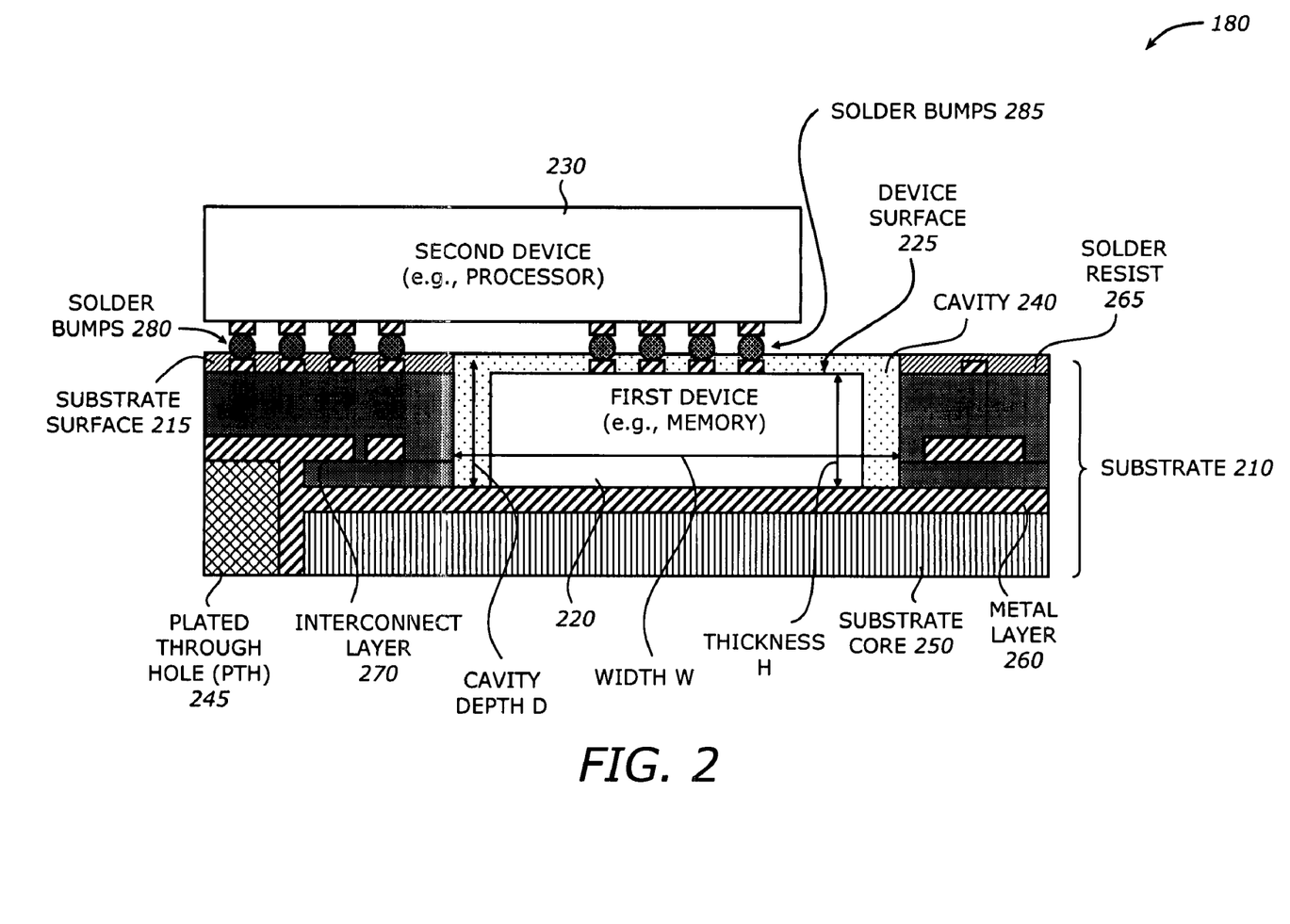
FIG. 2 is a diagram illustrating a structure of interconnected devices according to one embodiment of the invention.

FIG. 2 is a diagram illustrating the structure 190 of interconnected devices according to one embodiment of the invention. The structure 190 includes a substrate 210, a first device 220, and a second device 230.

The substrate 210 has a substrate surface 215, a cavity 240, a plated through hole (PTH) 245, a substrate core 250, a metal layer 260, and an interconnect layer 270. The substrate surface 215 is around the cavity 240. It has contact pads and solder bumps 280 deposited on the contact pads. The solder bumps 280 on the substrate surface 215 are used to attach to the second device 230. The cavity 240 has a depth D and a width W. The depth D and the width W are selected to match the size of the first device 220. The PTH 245 connects the metal layers inside the substrate 210. The substrate core 250 is made of materials such as FR-4. It may consist of a woven fiberglass mat and a flame resistant epoxy resin. The metal layer 260 may be a copper layer. It provides connectivity to various layers in the substrate 210. The interconnect layer 270 has plated metal such as copper to provide interconnections to various layers in the substrate 210 and the first device 230.

The first device 220 is placed inside the cavity 240. It has a device surface 225 and a thickness H. Around the first device 220 and inside the cavity 240 is solder resist 265 to provide support and sealing for the first device 220. The first device 220 is therefore embedded in the substrate 210. The solder resist 265 may also be used to form solder bumps 285 with contact pads connecting to the first device 220. The solder bumps 285 are used to attach the first device 220 to the second device 230. The depth D of the cavity 240 is selected to match the thickness H of the first device 220 such that when the first device 220 is placed inside the cavity 240, the device surface 225 is approximately planar with the substrate surface 215. Typically, the cavity depth D is approximately equal to the thickness H and the height of the solder resist deposited on top of the first device 220. The solder bumps 285 and the solder bumps 280 are aligned or planar so that when the second device 230 is attached to the substrate 210 and the first device 220, it is positioned on a flat surface. The first device 220 may be any device that needs to have a short interconnection distance to the second device 230. In one embodiment, it is the memory device such as the memory device 178 in FIG. 1B.

The second device 230 has bumps on its surface. In one embodiment, the bumps are stud bumps. The stud bumps may be made of gold and placed on the die bond pads of the second device 230. The gold stud bumps may be flattened or coined by mechanical pressure to provide a flatter top surface and more uniform bump heights. During component placement, the second device 230 is attached to the substrate 210 and the first device 240 via the bumps on the second device 230 and the solder bumps 280 and 285. The attachment may be made by reflowing, adhesives, or ultrasonic assembly. As described above, the depth D of the cavity 240 is selected according to the thickness H of the first device 220 and the height of the solder resist on top of the first device 220. The second device 230 is any device that may need the shortest interconnection distance to the first device 220. In one embodiment, it is the processor 176 shown in FIG. 1B.

Figure 3A:
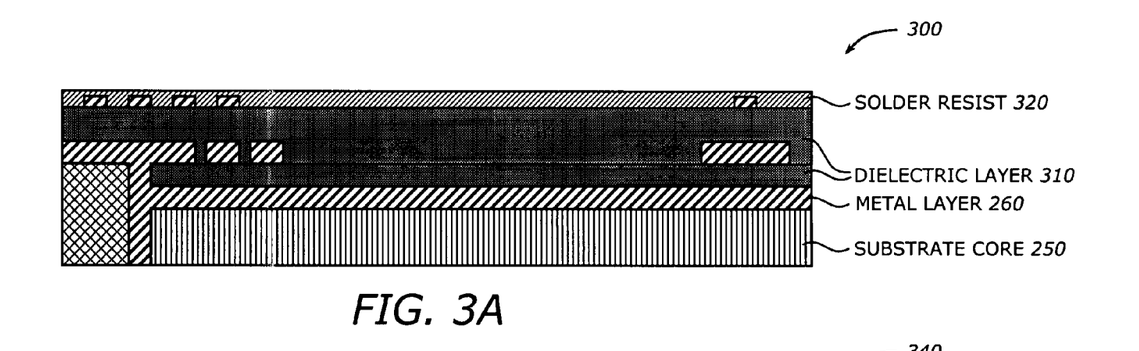
FIG. 3A is a diagram illustrating a substrate according to one embodiment of the invention.
Figure 3B:
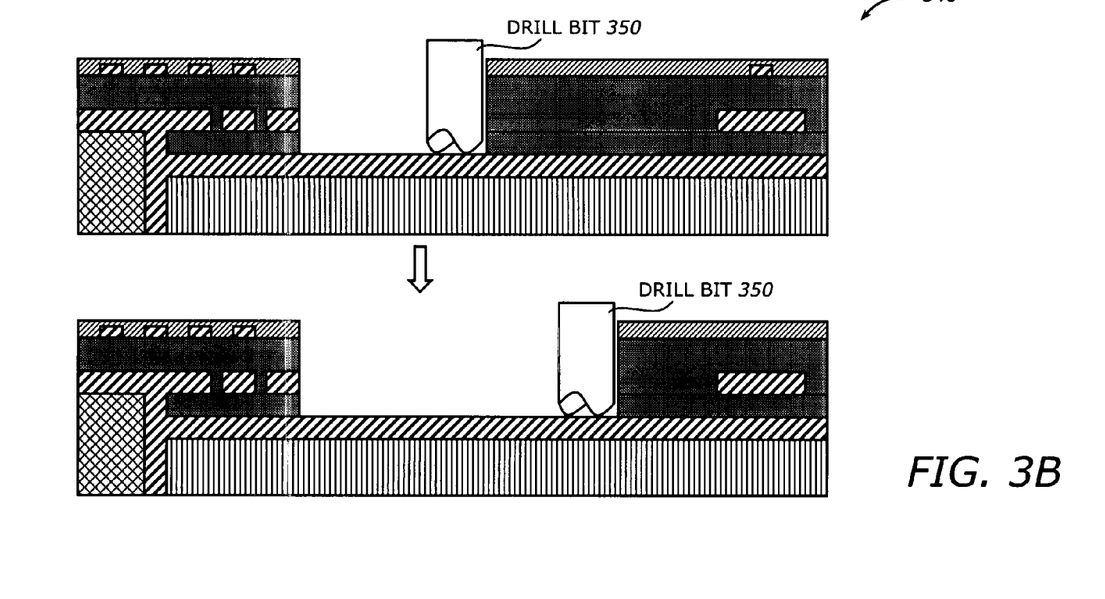
FIG. 3B is a diagram illustrating forming a cavity using drilling according to one embodiment of the invention.

The cavity 240 may be formed using one of two methods. FIGS. 3A and 3B show the first method. FIGS. 4A through 4F show the second method.

FIG. 3A is a diagram illustrating the substrate 210 according to one embodiment of the invention.

The substrate 210 is formed using conventional fabrication methods. It includes the substrate core 250, the metal (e.g., copper) layer 260, a dielectric layer 310, and a solder resist layer 320. Various interconnect patterns are formed in the substrate 210.

FIG. 3B is a diagram illustrating forming a cavity using drilling according to one embodiment of the invention. The dielectric layer 310 and the solder resist layer 320 may be drilled to form the cavity 240 using one of an etching process, a laser drilling, and a mechanical drilling bit. In one embodiment, the drilling is performed using a drill bit 350. The drill bit 350 is a precision mechanical route bit. It routes the cavity 240 until the desired depth D and width W have been achieved.

Figure 4A:
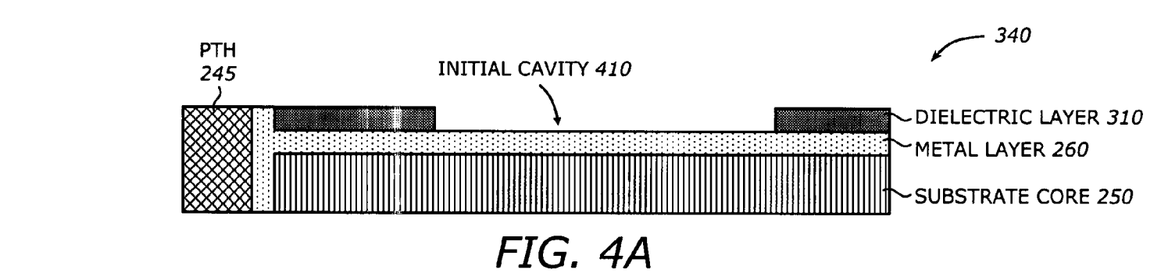
FIG. 4A is a diagram illustrating a first stage of forming cavity according to one embodiment of the invention.

FIG. 4A is a diagram illustrating a first stage of forming cavity according to one embodiment of the invention. In this stage, the metal layer 260 is deposited on the substrate core 250. Then, the dielectric layer 310 is deposited on the metal layer 260. The dielectric layer 310 is then etched or drilled to form an initial cavity 410 using laser drilling. The laser drilling uses a focused beam to ablate away the dielectric layer 310. Several laser processes may be used. Examples of these laser processes may include carbon dioxide ($CO_2$), Neodymium-doped yttrium aluminum garnet (YAG) (Nd:YAG), YAG/ultraviolet (UV), or excimer lasers. The $CO_2$ laser may operate at 9.3 to 10.6 μm. The YAG/UV may operate in the range 351-355 nm. The excimer laser may operate at 157 nm ($F_2$), 193 nm (ArF), 222 nm (KrCl), 248 nm (KrF), 308 nm (XeCl), or 351 nm (XeF).

Figure 4B:
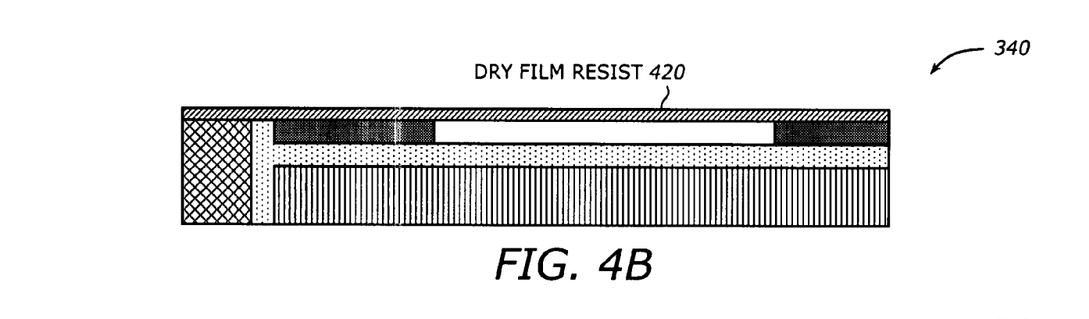
FIG. 4B is a diagram illustrating a second stage of forming cavity according to one embodiment of the invention.

FIG. 4B is a diagram illustrating a second stage of forming cavity according to one embodiment of the invention. In this stage, a dry film resist (DFR) 420 is deposited on the drilled dielectric layer 310. The dry film resist 420 is made of a coating material in the form of laminated photosensitive sheets. It is resistant to various electroplating and etching processes. The lamination of the dry film resist 420 may be performed using a tenting method. Before the DFR tenting, electroless copper is plated on the dielectric layer 310.

Figure 4C:
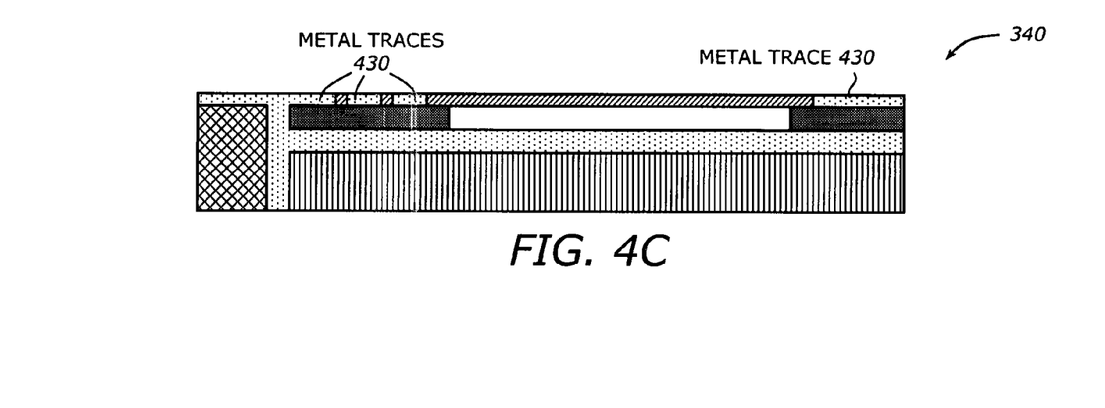
FIG. 4C is a diagram illustrating a third stage of forming cavity according to one embodiment of the invention.

FIG. 4C is a diagram illustrating a third stage of forming cavity according to one embodiment of the invention. The DFR 420 is exposed with lithography equipment and then is developed. Electrolytic copper plating and quick etching may be performed using a semi additive process (SAP). Metal traces 430 are formed on the dielectric layer 310.

Figure 4D:
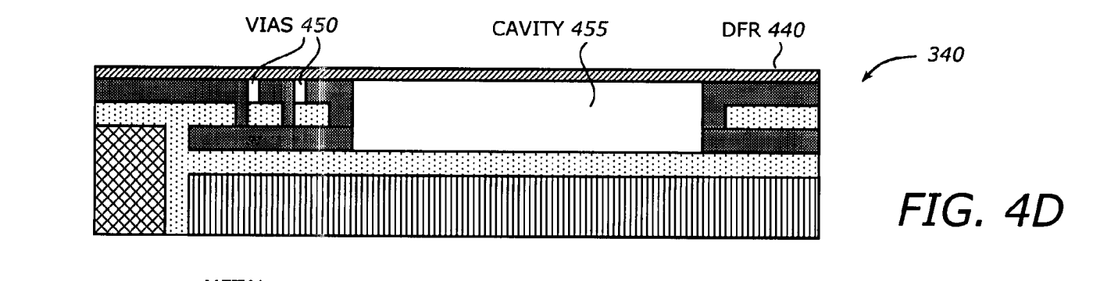
FIG. 4D is a diagram illustrating a fourth stage of forming cavity according to one embodiment of the invention.

FIG. 4D is a diagram illustrating a fourth stage of forming cavity according to one embodiment of the invention. In this stage, vias 450 may then be formed by laser drilling in the dielectric layer. A cavity 455 may be formed by laser drilling. A DFR 440 may then be deposited.

Figure 4E:
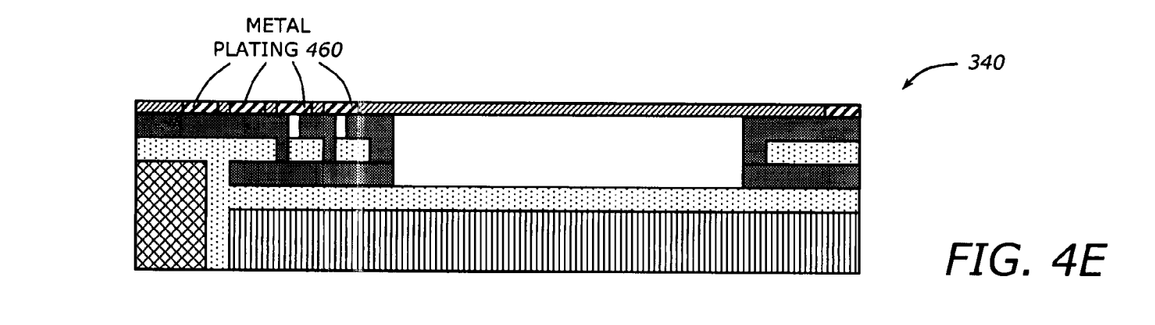
FIG. 4E is a diagram illustrating a fifth stage of forming cavity according to one embodiment of the invention.

FIG. 4E is a diagram illustrating a fifth stage of forming cavity according to one embodiment of the invention. In this stage, patterning and electrolytic copper plating and quick etching may be performed with the SAP. Metal plating 460 may then be formed.

Figure 4F:
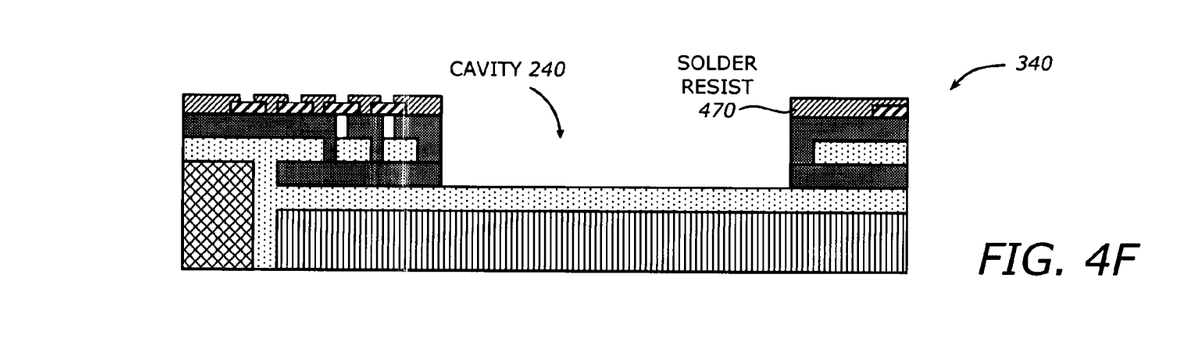
FIG. 4F is a diagram illustrating a sixth stage of forming cavity according to one embodiment of the invention.

FIG. 4F is a diagram illustrating a sixth stage of forming cavity according to one embodiment of the invention. The stages shown in FIG. 4B through 4E may be repeated as necessary to achieve the desired cavity depth D. In the end, when this desired depth reached, the DFR is removed to expose the cavity 240. The substrate 210 has a final solder resist layer 470, appropriate metal plates, and interconnection patterns.

Figure 5:
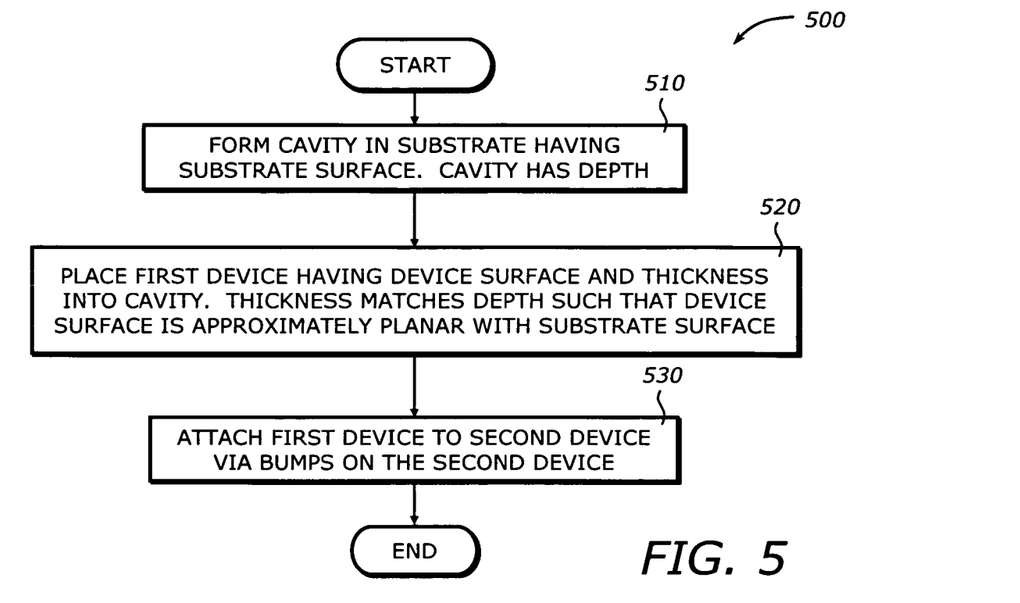
FIG. 5 is a flowchart illustrating a process to reduce interconnection length between two devices according to one embodiment of the invention.

FIG. 5 is a flowchart illustrating a process 500 to reduce interconnection length between two devices according to one embodiment of the invention.

Upon START, the process 500 forms a cavity in a substrate having a substrate surface (Block 510). The cavity has a depth and a width fitting a first device. Next, the process 500 places the first device having a device surface and a thickness into the cavity (Block 520). The thickness matches the depth of the cavity such that the device surface is approximately planar with the substrate surface. The cavity may be formed using one of two techniques. The first technique is illustrated in FIG. 6 and the second technique is illustrated in FIG. 7.

Then, the process 500 attaches the first device to a second device via bumps on the second device (Block 530). The bumps on the second device may be stud bumps. The stud bumps may be made of gold places on the die bond pads of the second device. The process 500 is then terminated.

Figure 6:
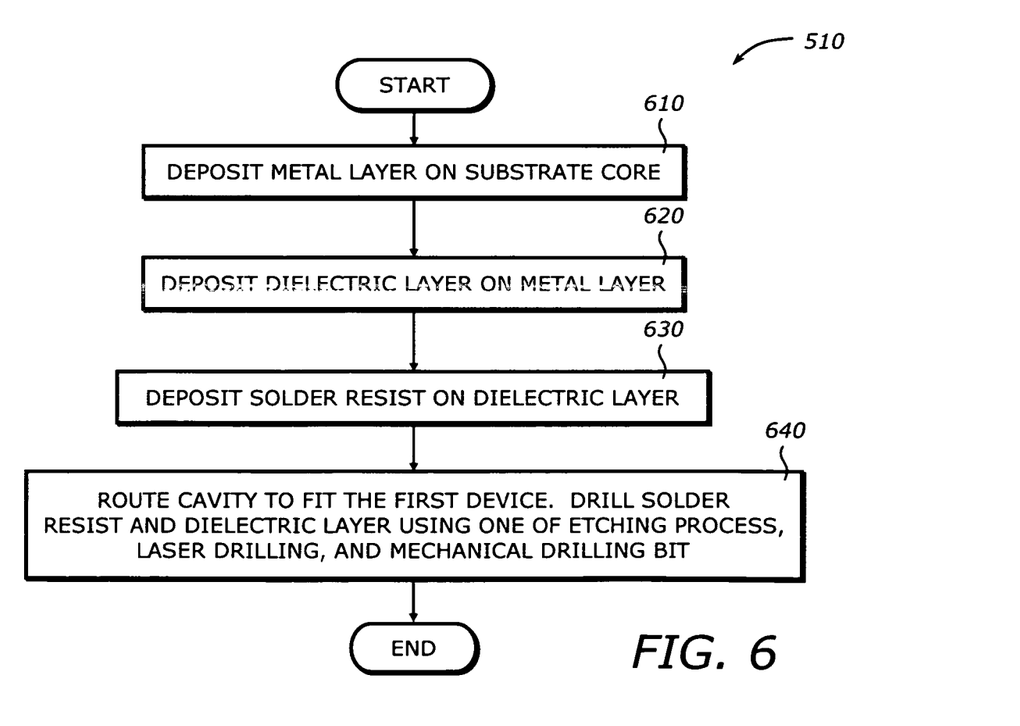
FIG. 6 is a flowchart illustrating a process to form a cavity using direct drilling according to one embodiment of the invention.
Figure 7:
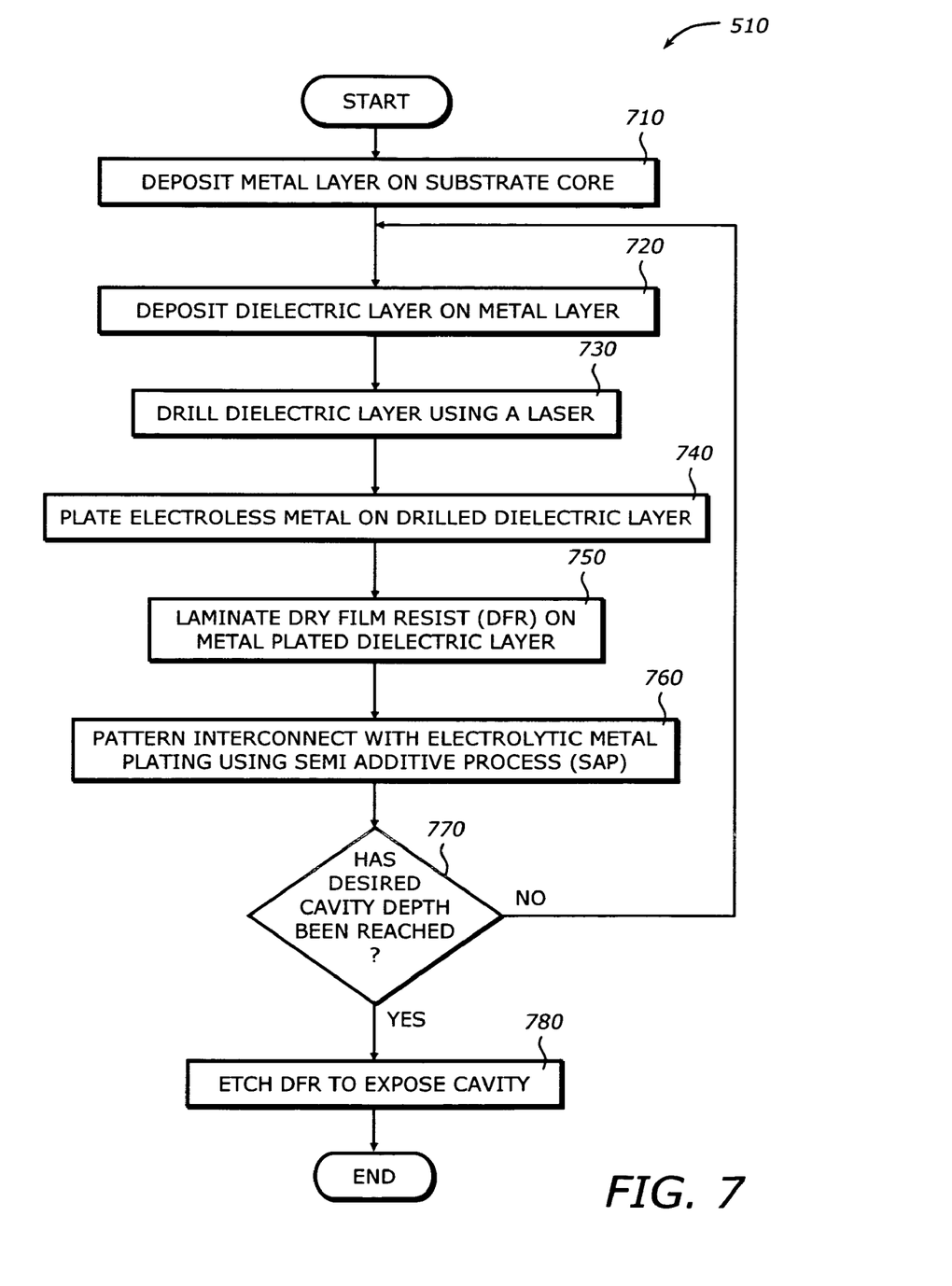
FIG. 7 is a flowchart illustrating a process to form a cavity using semi additive process according to one embodiment of the invention.

FIG. 6 is a flowchart illustrating the process 510 shown in FIG. 5 to form a cavity using direct drilling according to one embodiment of the invention.

Upon START, the process 510 deposits a metal layer on a substrate core (Block 610). Next, the process 510 deposits a dielectric layer on the metal layer (Block 620). Then, the process 510 deposits a solder resist on the dielectric layer (Block 630).

Next, the process 510 routes the cavity to fit the first device (Block 640), i.e., when the desired depth and width have been reached. The routing may be performed by drilling the solder resist and the dielectric layer using one of an etching process, a laser drilling, and a mechanical drilling bit. The etching process may be a wet etching or a dry etching (including isotropic etching or anisotropic etching). The process 510 is then terminated.

FIG. 7 is a flowchart illustrating the process 510 to form a cavity using semi additive process according to one embodiment of the invention.

Upon START, the process 510 deposits a metal layer on a substrate core (Block 710). Next, the process 510 deposits a dielectric layer on the metal layer (Block 720). Then, the process 510 drills the dielectric layer using a laser (Block 730). The drilling forms an initial cavity with the desired width and an initial depth.

Next, the process 510 plates electroless metal (e.g., copper) on the drilled dielectric layer (Block 740). Then, the process 510 laminates a dry film resist (DFR) on the metal plated dielectric layer (Block 750). Next, the process 510 patterns interconnect with electrolytic metal plating using semi additive process (SAP) (Block 760).

Then, the process 510 determines if the desired cavity depth has been reached (Block 770). If not, the process 510 returns to Block 720 to continue the SAP to enlarge the cavity depth. Otherwise, the process 510 etches or removes the final DFR to expose the cavity (Block 780). The process 510 is then terminated.

Figure 8:
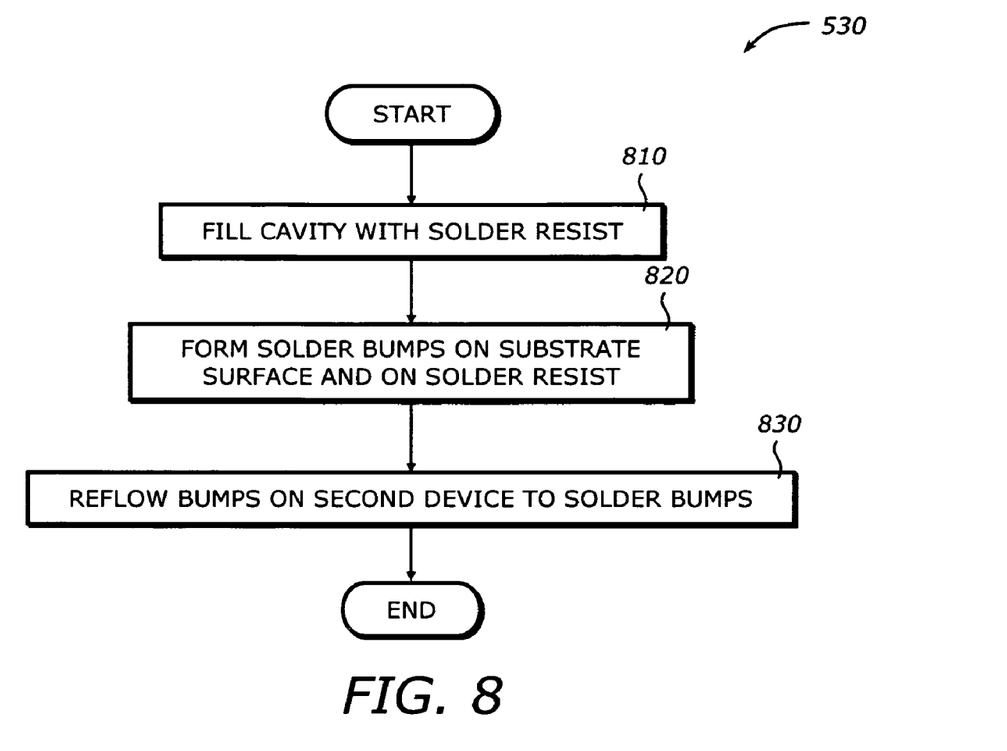
FIG. 8 is a flowchart illustrating a process to attach devices according to one embodiment of the invention.

FIG. 8 is a flowchart illustrating the process 530 shown in FIG. 5 to attach devices according to one embodiment of the invention.

Upon START, the process 530 fills the cavity with a solder resist (Block 810) to surround the first device. Then, the process 530 forms solder bumps on the substrate surface and on the solder resist on top of the first device at the device surface (Block 820). Next, the process 530 reflows the bumps on the second device to the solder bumps on the substrate surface and the device surface (Block 830). The process 530 is then terminated.

Embodiments of the invention have been described with a first device embedded in a substrate. The substrate has a substrate surface and a cavity to house the first device. A second device is attached to the first device and the substrate surface via bumps on the second device. Since the interconnection between the two devices is made directly through the solder bumps, the interconnection length is shortest. This interconnection method results in improved signal quality and reduces propagation delays between the first and second devices.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   forming a cavity in a substrate having a substrate surface, the cavity having a depth;
   placing a first device having a device surface and a thickness into the cavity, the thickness matching the depth such that the device surface is approximately planar with the substrate surface; and
   attaching the first device to a second device via bumps on the second device; wherein attaching the first device to the second device comprises:
   filling the cavity with a solder resist;
   forming solder bumps on the substrate surface and on the solder resist; and
   reflowing the bumps on the second device to the solder bumps.

2. The method of claim 1 wherein forming the cavity comprises:
   depositing a metal layer on a substrate core.

3. The method of claim 2 wherein forming the cavity further comprising:
   depositing a dielectric layer on the metal layer;
   depositing a solder resist on the dielectric layer; and
   routing the cavity to fit the first device.

4. The method of claim 3 wherein routing the cavity comprises:
   drilling the solder resist and the dielectric layer using one of an etching process, a laser drilling, and a mechanical drilling bit.

5. The method of claim 2 wherein forming the cavity further comprises:
   depositing a dielectric layer on the metal layer;
   drilling the dielectric layer using a laser;
   plating electroless metal on the drilled dielectric layer;
   laminating a dry film resist (DFR) on the metal plated dielectric layer; and
   patterning interconnect with electrolytic metal plating using a semi additive process (SAP).

6. The method of claim 5 wherein forming the cavity further comprises:
   etching the DFR to expose the cavity.

7. The method of claim 1 wherein the first device is a memory device and the second device is a processor.

* * * * *

UNITED STATES PATENT AND TRADEMARK OFFICE
CERTIFICATE OF CORRECTION

| | | |
|---|---|---|
| PATENT NO. | : 7,592,202 B2 | Page 1 of 1 |
| APPLICATION NO. | : 11/395021 | |
| DATED | : September 22, 2009 | |
| INVENTOR(S) | : Toyama et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 543 days.

Signed and Sealed this

Twenty-first Day of September, 2010

David J. Kappos
*Director of the United States Patent and Trademark Office*